United States Patent
Sakurano et al.

(10) Patent No.: US 9,472,706 B2
(45) Date of Patent: Oct. 18, 2016

(54) IMAGE SENSOR HAVING A PLURALITY OF PHOTOTRANSISTORS SEPARATED BY TRENCH-GATE STRUCTURES AND METHOD OF MANUFACTURING THE SAME

(71) Applicants: Katsuyuki Sakurano, Hyogo (JP); Takaaki Negoro, Osaka (JP); Katsuhiko Aisu, Hyogo (JP); Kazuhiro Yoneda, Osaka (JP); Yasukazu Nakatani, Hyogo (JP); Hirofumi Watanabe, Hyogo (JP)

(72) Inventors: Katsuyuki Sakurano, Hyogo (JP); Takaaki Negoro, Osaka (JP); Katsuhiko Aisu, Hyogo (JP); Kazuhiro Yoneda, Osaka (JP); Yasukazu Nakatani, Hyogo (JP); Hirofumi Watanabe, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/560,037

(22) Filed: Dec. 4, 2014

(65) Prior Publication Data

US 2015/0171129 A1   Jun. 18, 2015

(30) Foreign Application Priority Data

Dec. 16, 2013 (JP) ................................ 2013-259021

(51) Int. Cl.
*H01L 31/113* (2006.01)
*H01L 27/146* (2006.01)

(52) U.S. Cl.
CPC ....... *H01L 31/1136* (2013.01); *H01L 27/1463* (2013.01); *H01L 27/14614* (2013.01); *H01L 27/14623* (2013.01); *H01L 27/14638* (2013.01); *H01L 27/14689* (2013.01)

(58) Field of Classification Search
None
See application file for complete search history.

(56) References Cited

U.S. PATENT DOCUMENTS

| | | |
|---|---|---|
| 5,227,793 A | 7/1993 | Aisu |
| 5,412,243 A | 5/1995 | Morishita |
| 5,656,841 A | 8/1997 | Watanabe et al. |
| 5,825,673 A | 10/1998 | Watanabe |
| 6,075,404 A | 6/2000 | Shindoh et al. |
| 6,271,730 B1 | 8/2001 | Abe et al. |

(Continued)

FOREIGN PATENT DOCUMENTS

| | | |
|---|---|---|
| DE | 102011056369 A1 | 6/2013 |
| JP | 2002-176179 | 6/2002 |
| JP | 2013-187527 | 9/2013 |

OTHER PUBLICATIONS

U.S. Appl. No. 14/305,821, filed Jun. 16, 2014.

(Continued)

*Primary Examiner* — Charles Garber
*Assistant Examiner* — Brigitte Paterson
(74) *Attorney, Agent, or Firm* — Cooper & Dunham LLP

(57) ABSTRACT

A semiconductor device and a method of manufacturing a semiconductor device are disclosed. The method includes forming a trench, in a vertical direction of a semiconductor substrate having a plurality of photoelectric converting elements arranged on the semiconductor device, at positions between the photoelectric converting elements that are next to each other, forming a first conductive-material layer in and above the trench by implanting a first conductive material into the trench after an oxide film is formed on an inner wall of the trench, forming a first conductor by removing the first conductive-material layer excluding a first conductive portion of the first conductive-material layer implanted into the trench, and forming an upper gate electrode above the first conductor, the upper gate electrode configured to be conductive with the first conductor. The semiconductor device includes a semiconductor substrate, an image sensor, a trench, a first conductor, and an upper gate electrode.

10 Claims, 7 Drawing Sheets

(56) References Cited

U.S. PATENT DOCUMENTS

| | | |
|---|---|---|
| 6,278,322 B1 | 8/2001 | Aisu et al. |
| 2001/0020844 A1 | 9/2001 | Andoh et al. |
| 2003/0001206 A1 | 1/2003 | Negoro et al. |
| 2003/0197552 A1 | 10/2003 | Watanabe |
| 2003/0214336 A1 | 11/2003 | Watanabe |
| 2004/0004992 A1 | 1/2004 | Aota et al. |
| 2004/0175007 A1 | 9/2004 | Aisu |
| 2004/0183119 A1 | 9/2004 | Negoro et al. |
| 2004/0227183 A1 | 11/2004 | Negoro et al. |
| 2005/0002429 A1 | 1/2005 | Watanabe |
| 2005/0017297 A1 | 1/2005 | Shimizu et al. |
| 2005/0141395 A1 | 6/2005 | Nakatani |
| 2005/0218478 A1 | 10/2005 | Watanabe |
| 2006/0057759 A1* | 3/2006 | Zhang ............... H01L 27/14689 438/57 |
| 2006/0065949 A1 | 3/2006 | Kato et al. |
| 2006/0138546 A1 | 6/2006 | Negoro et al. |
| 2006/0152284 A1 | 7/2006 | Morino |
| 2006/0197581 A1 | 9/2006 | Chun et al. |
| 2007/0023517 A1 | 2/2007 | Tan et al. |
| 2007/0047332 A1 | 3/2007 | Aota et al. |
| 2007/0102638 A1 | 5/2007 | Watanabe |
| 2007/0109039 A1 | 5/2007 | Watanabe |
| 2007/0111557 A1 | 5/2007 | Higashiguchi et al. |
| 2007/0188216 A1 | 8/2007 | Negoro |
| 2008/0012543 A1 | 1/2008 | Negoro |
| 2008/0100276 A1 | 5/2008 | Negoro |
| 2008/0248606 A1* | 10/2008 | Wilson ............... H01L 27/1463 438/73 |
| 2009/0033420 A1 | 2/2009 | Negoro |
| 2009/0064791 A1 | 3/2009 | Ueda et al. |
| 2011/0012582 A1 | 1/2011 | Aisu |
| 2011/0042745 A1 | 2/2011 | Negoro |
| 2011/0084322 A1* | 4/2011 | Kang ............................ 257/292 |
| 2011/0155913 A1 | 6/2011 | Noguchi et al. |
| 2011/0169570 A1 | 7/2011 | Aota et al. |
| 2011/0181358 A1 | 7/2011 | Aisu |
| 2011/0185326 A1 | 7/2011 | Ueda et al. |
| 2012/0013383 A1 | 1/2012 | Negoro et al. |
| 2012/0032733 A1 | 2/2012 | Negoro |
| 2012/0086845 A1 | 4/2012 | Enomoto et al. |
| 2012/0181430 A1 | 7/2012 | Noguchi et al. |
| 2013/0127504 A1 | 5/2013 | Hayashi et al. |
| 2013/0187030 A1 | 7/2013 | Hayashi et al. |
| 2013/0234277 A1* | 9/2013 | Negoro ............ H01L 27/14681 257/443 |
| 2013/0240716 A1 | 9/2013 | Hayashi et al. |
| 2013/0284931 A1 | 10/2013 | Nagahisa et al. |
| 2014/0239158 A1 | 8/2014 | Hayashi et al. |

OTHER PUBLICATIONS

Jun. 5, 2015 European search report in corresponding European Patent Application No. 14197211.7.

* cited by examiner

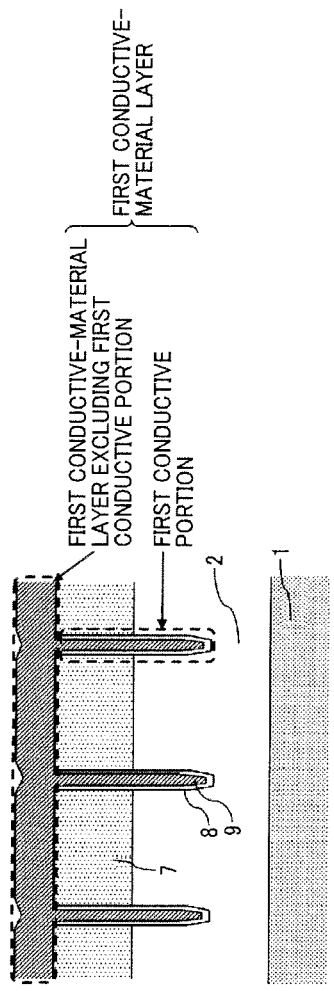
FIG. 2E
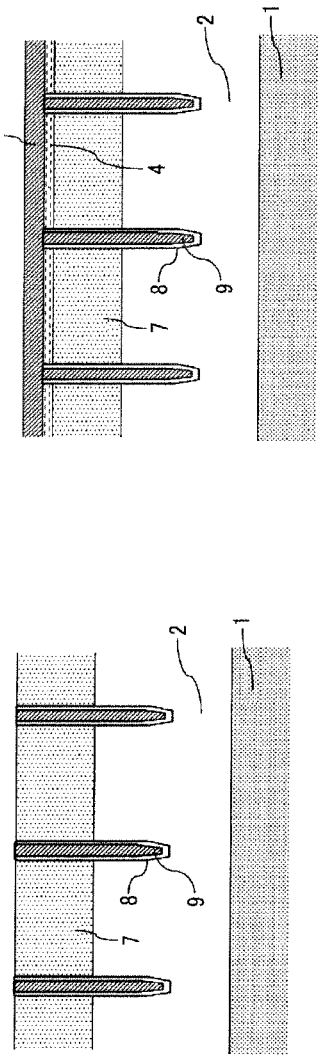
FIG. 2F
FIG. 2G

PARASITIC BIPOLAR
TRANSISTOR Tr

IMAGE SENSOR HAVING A PLURALITY OF PHOTOTRANSISTORS SEPARATED BY TRENCH-GATE STRUCTURES AND METHOD OF MANUFACTURING THE SAME

CROSS-REFERENCE TO RELATED APPLICATION

This patent application is based on and claims priority pursuant to 35 U.S.C. §119(a) to Japanese Patent Application No. 2013-259021, filed on Dec. 16, 2013, in the Japan Patent Office, the entire disclosure of which is hereby incorporated by reference herein.

BACKGROUND

1. Technical Field

Example embodiments of the present invention generally relate to a semiconductor device and a semiconductor manufacturing method.

2. Background Art

As devices on which photoelectric converting elements are two-dimensionally arranged, solid-state image sensing elements such as complementary metal oxide semiconductor (CMOS) sensors and charge-coupled device (CCD) sensors are known. In particular, a CMOS sensor uses a photodiode as photoelectric converting element, and outputs the signals of the photodiode in a selective manner using metal oxide semiconductor field-effect transistors (MOSFET) provided for each pixel. Due to this configuration, it is possible to build elements such as photoelectric converting elements, output selecting switches provided for each pixel, and peripheral circuits, all in the same substrate by performing known CMOS semiconductor processes. In recent years, processing rules are divided into finer sections, and the size of one pixel is reduced. Accordingly, imaging at higher resolution is progressing.

The photodiode used as photoelectric converting element is formed by PN junction, and a depletion layer is extended by applying reverse bias voltage to the photodiode. The wavelength of light that can be converted into electric charge is determined by the width of the depletion layer. The PN junction is formed in the direction perpendicular to the Si substrate, and the depletion layer extends in the direction of the depth of the substrate. Accordingly, the photoelectric conversion of incident light is performed at a deep portion of the Si substrate. The incident light does not always have an angle of ninety degree but has a variety of angles. For this reason, the electric charge caused by the incident light may be output to the pixel next to the pixel that the light has actually entered. As the size of one pixel is reduced, such confusion about pixel output tends to occur more easily.

SUMMARY

Embodiments of the present invention described herein provide a semiconductor device and a method of manufacturing a semiconductor device. The method includes forming a trench, in a vertical direction of a semiconductor substrate having a plurality of photoelectric converting elements arranged on the semiconductor device, at positions between the photoelectric converting elements that are next to each other, forming a first conductive-material layer in and above the trench by implanting a first conductive material into the trench after an oxide film is formed on an inner wall of the trench, forming a first conductor by removing the first conductive-material layer excluding a first conductive portion of the first conductive-material layer implanted into the trench, and forming an upper gate electrode above the first conductor, the upper gate electrode configured to be conductive with the first conductor. The semiconductor device includes a semiconductor substrate, an image sensor configured to include a plurality of photoelectric converting elements arranged on the semiconductor substrate, a trench formed at positions between the photoelectric converting elements that are next to each other in the semiconductor substrate, a first conductor implanted into the trench, and an upper gate electrode formed above the first conductor, the upper gate electrode configured to be conductive with the first conductor. A grain boundary of a composition surface between the first conductor and the upper gate electrode is discontinuous.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

FIGS. 2D to 2G illustrate a second set of process flow of a semiconductor device manufacturing method according to an example embodiment of the present invention.

Figure 1:
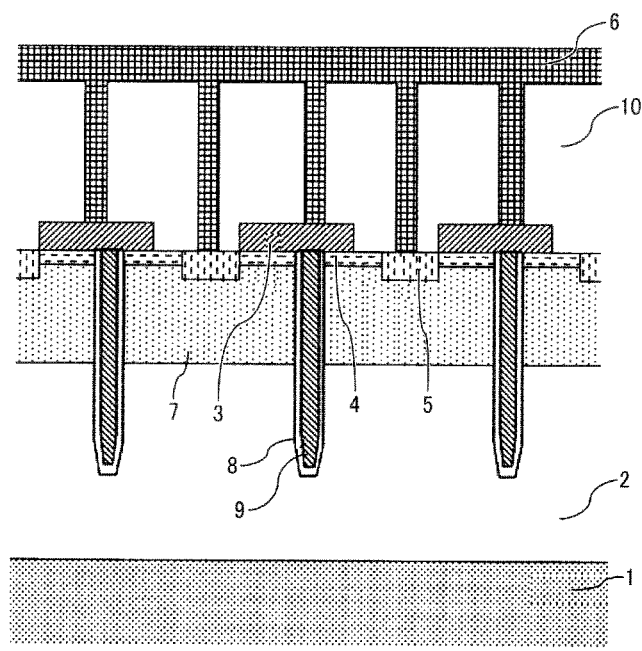
FIG. 1 is a schematic cross-sectional view of the lead of a gate electrode in a semiconductor device according to an example embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Figure 3:
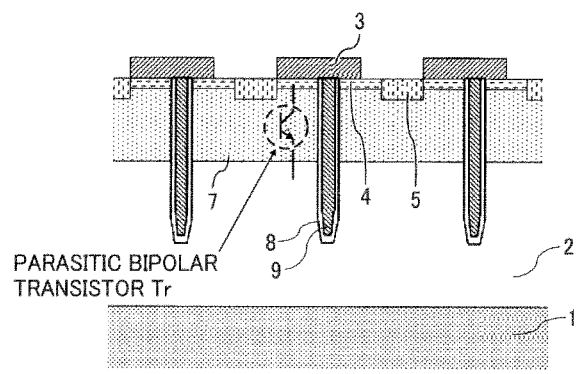
FIG. 3 is a schematic cross-sectional view of a parasitic bipolar transistor in a semiconductor device according to an example embodiment of the present invention.
Figure 4:
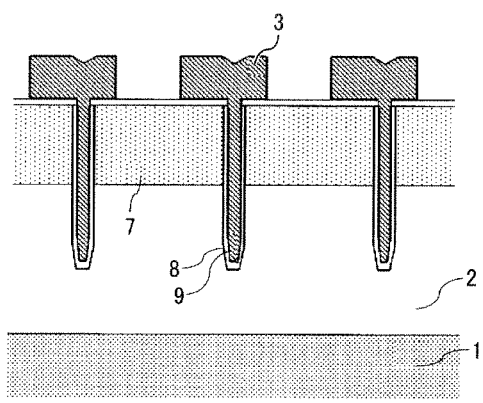
FIG. 4 is a schematic cross-sectional view of the lead of a gate electrode in a semiconductor device for which a conventional trench-gate electrode is provided.
Figure 5:
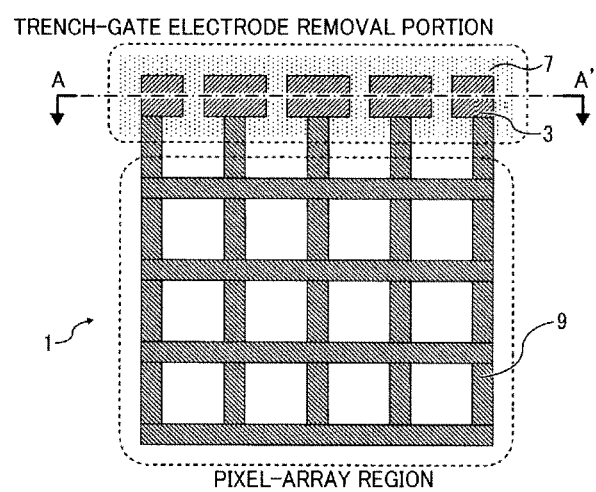
FIG. 5 is a schematic top view of a semiconductor device for which a trench-gate electrode is provided, according to an example embodiment of the present invention.

If a pixel is separated from the other pixels by a deep trench as illustrated in FIG. 5, confusion about photoelectric charge caused at neighboring pixels can be prevented. FIG. 5 is a schematic top view of a semiconductor device for which a trench-gate electrode is provided, according to an example embodiment of the present invention. FIGS. 1 to 4 illustrate the cross section A-A' illustrated in FIG. 5, as will be described later. As illustrated in FIG. 5, a deep-trench implanted polysilicon 9 is formed deep inside the pixel-array region and trench-gate electrode removal portion in the vertical direction of FIG. 5. The deep-trench implanted polysilicon 9 separates one pixel from the other pixels, and serves as a gate electrode together with the N-type gate electrode 3.

As illustrated in FIG. 5, pixels are electrically separated from each other by deep trenches. Accordingly, there are advantageous effects that it becomes easier to reduce the distance among neighboring pixels and the size of one pixel is reduced, compared with known CMOS semiconductor processes where neighboring pixels are separated from each other by oxide films and PN junction. The same can be said to cases where P-type is used in alternative to N-type.

JP-2013-187527-A discloses a semiconductor device with a Si substrate, where the semiconductor device includes an image sensor in which photoelectric converting elements are two-dimensionally arranged, and the pixels are separated from each other by deep trenches into which gate electrodes are implanted. However, in the conventional method of extracting an implanted gate electrode from a deep trench, the polysilicon that is left when the film of the deep-trench implanted polysilicon 9 is formed as illustrated in FIG. 4 is etched as the N-type gate electrode 3, for the purpose of achieving insulation from the Si substrate to prevent photoelectric current from being generated when the semiconductor substrate is irradiated with light. For this reason, the step height of the N-type gate electrode 3 is left until the final stage of manufacturing, and the step height of the implanted polysilicon (i.e., the thickness of the N-type gate electrode illustrated in FIG. 4: about 0.6 μm) tends to be greater. As a result, it is difficult to achieve flat configuration, and a pattern formation failure may occur in photomechanical processes or etching processes when the size of one pixel is small. If the flat configuration is simply targeted, photoelectric current is developed by a parasitic phototransistor at a lead of the gate electrode, as described later, when the semiconductor device is irradiated with light.

An example embodiment of the present invention is briefly described below. According to the present example embodiment, planar configuration is achieved without using PN junction for the pixel insulation in a two-dimensional image sensor. Instead, deep trenches are firstly formed, and the inner walls of the deep trenches are oxidized. Secondly, the deep trenches are filled with polysilicon, and when the polysilicon is extracted as electrodes, the polysilicon implanted into the deep trenches (i.e., deep-trench implanted polysilicon) and gate polysilicon (i.e., N-type gate electrode 3) whose film is formed later are made electrically conductive with each other. More specifically, planar configuration is achieved as follows. The implanted polysilicon is removed and flattened by etchback, and then polysilicon gate electrode is formed through performing CMOS semiconductor processes. By so doing, the implanted polysilicon can be extracted as electrodes while flattening the implanted polysilicon.

A semiconductor device and semiconductor device manufacturing method according to an example embodiment of the present invention are described below in detail.

<Semiconductor Device>

FIG. 1 is a schematic cross-sectional view of the lead of a gate electrode in a semiconductor device according to the present example embodiment of the present invention. Note that the cross section of FIG. 1 corresponds to the cross section A-A' illustrated in FIG. 5. The semiconductor device according to the present example embodiment includes an image sensor, and this image sensor includes a plurality of photoelectric converting elements arranged on a semiconductor substrate. It is desired that the photoelectric converting elements be two-dimensionally arranged, and a phototransistor is preferred. Here, a semiconductor substrate includes an N+Si semiconductor substrate 1, an N-type Si layer 2, and N-type gate electrodes 3, which are laminated in the listed order.

In this semiconductor substrate, trenches are formed in the vertical direction at positions between the adjacent photoelectric converting elements that are next to each other. These trenches have the depth equal to the height of the N-type gate electrode 3 and some of the height of the N-type Si layer 2, and deep-trench inner wall oxide films 8 are formed on the inner walls of the trenches. Moreover, the trenches are filled with the deep-trench implanted polysilicon 9. The deep-trench implanted polysilicon 9 serves as a first conductor according to the present example embodiment, and the N-type gate electrodes 3 are formed above the deep-trench implanted polysilicon 9 as upper gate electrodes.

According to the present example embodiment, the top surface of the deep-trench implanted polysilicon 9 is flat, and the N-type gate electrode 3 formed on the top surface of the deep-trench implanted polysilicon 9 is also flattened. The N-type gate electrode 3 and the deep-trench implanted polysilicon 9 are rendered conductive with each other to serve as a gate electrode. Moreover, with the semiconductor device according to the present example embodiment, the N-type gate electrode 3 is formed thin to the thickness of about 0.2 μm, and the reduction in step height between the N-type gate electrode 3 and the layer beneath is achieved. In the conventional semiconductor device as illustrated in FIG. 4, the thickness (step height) of the N-type gate electrode 3 is about 0.6 μm. Note that the grain boundary of the composition surface between the deep-trench implanted polysilicon 9 and the N-type gate electrode 3 is discontinuous.

An N-type impurity diffused layer 4 having the same conductivity as the N-type gate electrode 3 is provided so as to contact the N-type gate electrode 3. Note that the N-type impurity diffused layer 4 serves as an impurity diffused layer. As illustrated in FIG. 1, the N-type gate electrode 3 is stacked on the N-type impurity diffused layer 4, and one horizontal end of the N-type impurity diffused layer 4 contacts the deep-trench inner wall oxide film 8. Further, a P+ impurity diffused layer 5 having the reversed conductivity to the N-type impurity diffused layer 4 is provided so as to be adjacent to a horizontal end of the N-type impurity diffused layer 4 opposite to the deep-trench inner wall oxide film 8. Note that the P+ impurity diffused layer serves as a second conductor according to the present example embodiment. As illustrated in FIG. 1, the N-type impurity diffused layer 4 and the P+ impurity diffused layer 5 are arranged in the same plane, and the N-type impurity diffused layer 4 is arranged on both right and left sides of the P+ impurity diffused layer 5 in the region between deep trenches. Here, it is desired that the N-type impurity diffused layer 4 and the P+ impurity diffused layer have the same electrical potential.

In the present example embodiment of the present invention, it is desired that a light-shielding member that blocks light from reaching the P+ impurity diffused layer 5 (second conductor) be provided on a side where light is incident, and a metal wire 6 is preferred as such a light-shielding member. By adopting such configuration as above, amplification of excessive photoelectric current is prevented. The metal wire 6 is arranged so as to be conductive with the N-type gate electrode 3 and the P+ impurity diffused layer 5. By adopting such configuration as above, development of photoelectric current can be prevented. Between the metal wire 6 and the N+Si semiconductor substrate 1 or the like, an interlayer insulator film 10 is formed. Note that any commonly-used material can be used for the materials of the semiconductor device according to the present example embodiment described above.

<Semiconductor Device Manufacturing Method>

Figure 2B:
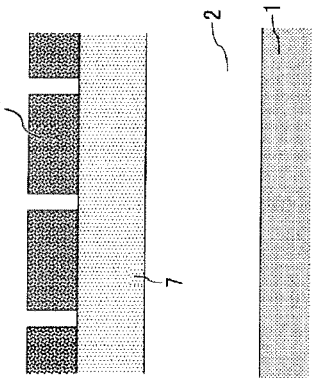
FIGS. 2A to 2C illustrate a first set of process flow of a semiconductor device manufacturing method according to an example embodiment of the present invention.
Figure 2D:
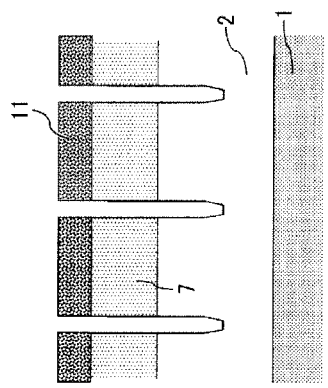
Figure 2A:
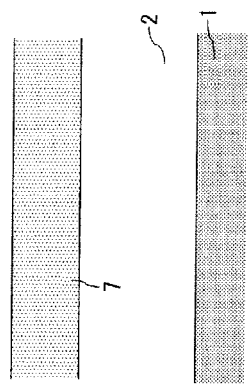
Figure 2C:
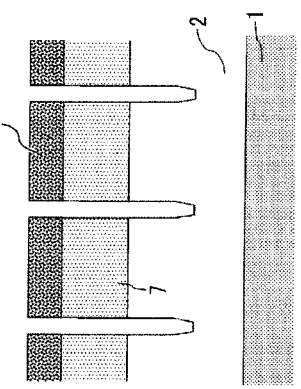
Figure 2H:
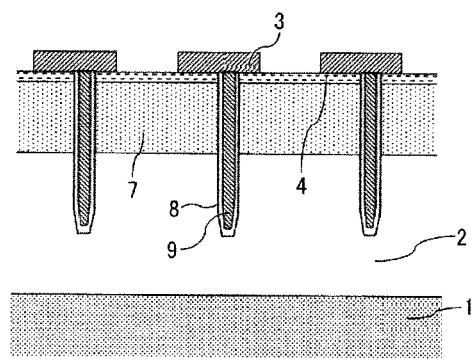
FIGS. 2H to 2J illustrate a third set of process flow of a semiconductor device manufacturing method according to an example embodiment of the present invention.
Figure 2I:
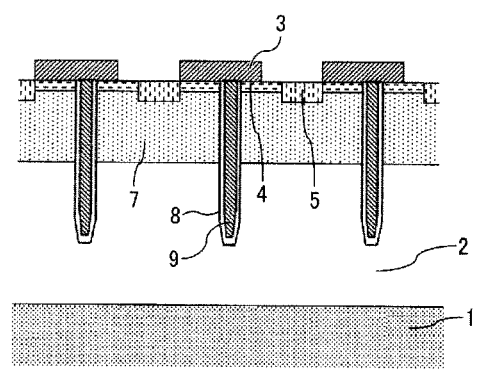
Figure 2J:
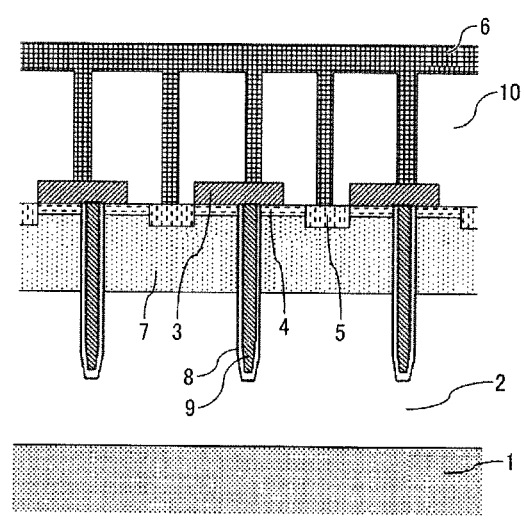

Next, a method of manufacturing a semiconductor device according to an example embodiment of the present invention is described. FIGS. 2A to 2C illustrate a first set of process flow of the semiconductor device manufacturing method according to the present example embodiment of the present invention. FIGS. 2D to 2G illustrate a second set of process flow of the semiconductor device manufacturing method according to the present example embodiment of the present invention. FIGS. 2H to 2J illustrate a third set of process flow of the semiconductor device manufacturing method according to the present example embodiment of the present invention. The process flow of the semiconductor device manufacturing method in which electrodes are made in deep trenches for pixel insulation are described in detail along with the processes illustrated in FIGS. 2A to 2J.

As illustrated in FIG. 2A, the N-type Si layer 2 is grown on the N+Si semiconductor substrate 1 by epitaxial growth to form an N-type epitaxial silicon substrate. Into the region of photoelectric converting elements, for example, boron is injected with the conditions of 30 KeV and $5*10^{13}$ cm$^{-2}$, and drive-in diffusion is performed for an hour in the $N_2$ atmosphere with 1150° C. As a result, the P-type conductor 7 is formed.

<Trench Forming Process>

Next, a high-temperature oxide (HTO) film 11 is formed with the length of about 400 nm as a hard mask for deep trenches. Such a hard mask is formed by patterning the region of deep trench with a mask and performing oxide film etching. Here, each deep trench is configured to have the width of, for example, 0.3 to 0.4 μm (see FIG. 2B).

Next, the hard mask is used to form each deep trench. For example, microwave plasma etching is performed with $SF_6$, $O_2$, and Ar gas, and the P-type conductor 7 and the N-type Si layer 2 are vertically processed to form trenches with the depth of about 3.0 to 5.0 μm (see FIG. 2C). Because the hard mask is also etched, the HTO film 11 is made thin to the thickness of about 100 nm (see FIG. 2D).

Next, the HTO film 11 is removed by wet etching, and the inner walls of the deep trenches are oxidized. Then, the oxide film is removed. Here, the oxidation is performed, for example, by dry oxidation for 130 nm with 1050° C. By removing the oxide film, the damage of the microwave plasma etching can be recovered. Accordingly, crystal defect that may occur when deep trenches are formed is attenuated, and a leak that may occur when a photodiode is formed by PN junction is prevented.

<First Conductive-Material Layer Forming Process>

Next, an oxide film is formed again to insulate pixels from each other. Here, the oxidation is performed, for example, by wet oxidation for 20 nm with 850° C., to form the deep-trench inner wall oxide film 8. Then, the film of polysilicon is formed to fill the deep trenches, for example, for 800 nm (see FIG. 2E). Here, the polysilicon serves as a first conductive material, and extends to the deep trenches whose surfaces are covered by the deep-trench inner wall oxide film 8 and to the upper surface of the deep trenches and the P-type conductor 7. This extended polysilicon forms a first conductive-material layer. In other words, the first conductive-material layer includes the deep-trench implanted polysilicon 9 (i.e., a first conductive portion that later becomes a first conductor) and an extra portion (i.e., the portion directly above the deep-trench implanted polysilicon 9 and the portion formed above the P-type conductor 7).

<First Conductor Forming Process>

Next, the first conductive-material layer made of polysilicon is etched in its entirety, and the portion of the first conductive-material layer excluding the deep-trench implanted polysilicon 9 is removed. As a result, the deep-trench implanted polysilicon 9 that serves as the first conductor is formed (see FIG. 2F). Accordingly, the top portion of the deep-trench implanted polysilicon 9 is removed, and the top of the deep-trench implanted polysilicon 9 becomes flat having no level difference with the portion around.

<Upper Gate Electrode Forming Process and Impurity Diffused Layer Forming Process>

Next, local oxidation of silicon (LOCOS) is performed in accordance with general CMOS device manufacturing processes. Note that the formation of oxide film due to the LOCOS is avoided at the deep-trench portions, but a gate oxide film is formed. Such a gate oxide film is formed all over the top of the surface illustrated in FIG. 2F, for example, with the thickness of about 13.5 μm, and is removed later as described below. Next, etching of a gate oxide film is performed at a region (composition surface) where the deep-trench implanted polysilicon 9 (N-type) electrically contacts the N-type gate electrode 3. Note that the deep-trench implanted polysilicon 9 and the N-type gate electrode 3 are referred to as a first gate polysilicon and a second gate polysilicon, respectively. Next, the gate oxide film is removed, and the film of the second gate polysilicon is formed. Then, phosphate deposition is performed to form an N-type polysilicon gate (N-type gate electrode 3) (see FIG. 2G). When phosphate deposition is performed as described above, phosphorus of high concentration is diffused over the second gate polysilicon. Accordingly, phosphorus is also diffused over the surface of the P-type conductor 7 placed underneath, and the N-type impurity diffused layer 4 is formed. The second gate polysilicon is patterned later to form the N-type gate electrode 3 (see FIG. 2H).

Here, the grain boundary of the composition surface between the deep-trench implanted polysilicon 9 and the N-type gate electrode 3 is discontinuous. Moreover, when the gate oxide film is etched before the second gate polysilicon is patterned, undesired traces are left. By contrast, in the semiconductor device fabricated by the conventional method as illustrated in FIG. 4, the top surface of the deep-trench implanted polysilicon 9 is not removed but is used as the N-type gate electrode 3. In other words, the N-type gate electrode 3 is not newly formed, and no composition surface exists. Accordingly, there is no discontinuous grain boundary. Moreover, because the gate oxide film is not etched, no such undesired traces as described above are left.

With the semiconductor device according to the present example embodiment, the N-type gate electrode 3 is formed thin to the thickness of about 0.2 µm. By contrast, in the semiconductor device manufactured by the conventional method as illustrated in FIG. 4, it is necessary to fill the deep-trench implanted polysilicon 9 to the bottom of the deep trenches by a large amount. As a result, the thickness (step height) of the N-type gate electrode becomes about 0.6 µm.

In the present example embodiment, as an image sensor is involved, a gate electrode drawn to the outside of a light receiving element is also irradiated with light. As a result, a parasitic bipolar transistor is configured as illustrated in FIG. 3, where the N-type impurity diffused layer 4 formed by the second gate polysilicon, the P-type conductor 7, and the N-type Si layer 2 serve as an emitter, a base, and a collector, respectively. Moreover, a vertical parasitic MOS transistor is simultaneously configured by the emitter, the base, the collector, and the implanted gate electrode.

<Second Conductor Forming Process and Light-Shielding Member Forming Process>

In order to avoid the above situation, boron is injected into the P+ impurity diffused layer with the conditions of, for example, 30 Key and $3*10^{15}$ cm$^{-2}$, and the P+ impurity diffused layer 5 is formed as a high-concentration impurity diffused layer to obtain an electrode. Then, the P-type conductor 7 and the N-type impurity diffused layer 4 are connected to each other through the metal wire 6, and the emitter and the base of the parasitic bipolar transistor are short-circuited. By so doing, each of the parasitic bipolar transistor and the parasitic MOS transistor serves as a diode, and the amplification of the dark current or photoelectric current of a phototransistor is prevented.

However, photoelectric current is still developed because a parasitic photodiode still exists in the configuration according to the present example embodiment described above. As the light to a parasitic bipolar region that serves as a photodiode is shielded by covering the entirety of the parasitic bipolar region with the metal wire 6 that serves as a light-shielding member, excessive photoelectric current can be reduced to as small as dark current (see FIG. 2I and FIG. 2J).

The metal wire 6 that serves as a light-shielding member is formed by any known method. For example, the film of the metal wire 6 may be formed by general large scale integration (LSI) manufacturing methods, for example, by sputtering the mixture of titan and aluminum to which one percent of silicon has been added (Ti—Al-1% Si). The interlayer insulator film 10 is formed by any known methods, such as using the known LSI manufacturing methods. For example, the interlayer insulator film 10 may be formed by forming a tetraethyl orthosilicate (TEOS) oxide film of the order of 800 nm and performing reflowing processes of 920° C. on the formed TEOS oxide film.

The above-described embodiment may be applied to cases where P-type is used in alternative to N-type. As described above, a semiconductor device and a semiconductor device manufacturing method where the step height of a gate electrode drawn from deep trenches for pixel insulation is reduced are provided according to the example embodiments of the present invention described above.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A method of manufacturing a semiconductor device, the method comprising:
    forming a trench, in a vertical direction of a semiconductor substrate having a plurality of phototransistors arranged on the semiconductor device, at positions between the phototransistors that are next to each other;
    forming a first conductive-material layer in and above the trench by implanting a first conductive material into the trench after an oxide film is formed on an inner wall of the trench;
    forming a first conductor by removing the first conductive-material layer excluding a first conductive portion of the first conductive-material layer implanted into the trench;
    forming an upper gate electrode above the first conductor, the upper gate electrode being disposed in a vertical direction above the first conductor and being configured to be conductive with the first conductor; and
    forming a first impurity diffused layer having a same conductivity type as the upper gate electrode, the first impurity diffused layer contacting the upper gate electrode.

2. The method according to claim 1, further comprising:
    forming a second impurity diffused layer having a reversed conductivity type to the first impurity diffused layer, the second impurity diffused layer being disposed adjacent to the first impurity diffused layer in the semiconductor substrate.

3. The method according to claim 2, further comprising:
    forming a light-shielding member configured to shield the second impurity diffused layer from light.

4. The method according to claim 3, wherein the forming a light-shielding member includes making the light-shielding member be conductive with the upper gate electrode and the second impurity diffused layer.

5. A semiconductor device comprising:
    a semiconductor substrate;
    an image sensor including a plurality of phototransistors arranged on the semiconductor substrate;
    a trench formed at positions between the phototransistors that are next to each other on the surface of the semiconductor substrate;
    a first conductor implanted into the trench;
    an upper gate electrode formed above the first conductor, the upper gate electrode being disposed in a vertical direction above the first conductor and being configured to be conductive with the first conductor; and
    a first impurity diffused layer having a same conductivity type as the upper gate electrode,
    wherein the first impurity diffused layer contacts the upper gate electrode, and
    wherein a grain boundary of a composition surface between the first conductor and the upper gate electrode is discontinuous.

6. The semiconductor device according to claim 5, further comprising:
    a second impurity diffused layer disposed adjacent to the first impurity diffused layer, having a reversed conductivity type to the first impurity diffused layer, wherein the second impurity diffused layer has a same electrical potential as the first impurity diffused layer.

7. The semiconductor device according to claim 6, further comprising:
   a light-shielding member configured to shield the second impurity diffused layer from light.

8. The semiconductor device according to claim 7, wherein the light-shielding member is a metal wire.

9. The semiconductor device according to claim 5, wherein each phototransistor amongst the phototransistors is configured to generate and amplify a photoelectric current in response to light irradiation on the phototransistor.

10. The method according to claim 1, wherein each phototransistor amongst the phototransistors is configured to generate and amplify a photoelectric current in response to light irradiation on the phototransistor.

* * * * *